US009384167B2

(12) United States Patent
Case (10) Patent No.: US 9,384,167 B2
(45) Date of Patent: Jul. 5, 2016

(54) FORMAL VERIFICATION OF BOOTH MULTIPLIERS

(71) Applicant: Calypto Design Systems, Inc., San Jose, CA (US)

(72) Inventor: Michael L. Case, Pflugerville, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 277 days.

(21) Appl. No.: 14/019,365

(22) Filed: Sep. 5, 2013

(65) Prior Publication Data

US 2014/0067897 A1 Mar. 6, 2014

Related U.S. Application Data

(60) Provisional application No. 61/696,928, filed on Sep. 5, 2012.

(51) Int. Cl.
*G06F 7/52* (2006.01)
*G06F 17/10* (2006.01)
*G06F 17/50* (2006.01)
G06F 7/533 (2006.01)

(52) U.S. Cl.
CPC .............. *G06F 17/10* (2013.01); *G06F 17/504* (2013.01); *G06F 7/5338* (2013.01)

(58) Field of Classification Search
CPC ............................... G06F 17/10; G06F 17/504
USPC .................................................. 708/620–632
See application file for complete search history.

(56) References Cited

U.S. PATENT DOCUMENTS

| 7,506,017 | B1 * | 3/2009 | Dupenloup | ............... G06F 7/53 708/620 |
| 8,640,065 | B2 * | 1/2014 | Janssen | ................. G06F 17/504 716/106 |
| 2003/0105785 | A1 | 6/2003 | Kunz et al. | |
| 2007/0011633 | A1 * | 1/2007 | Weber | ................... G06F 17/504 716/103 |
| 2008/0222227 | A1 * | 9/2008 | Chiang | ................. G06F 7/5338 708/209 |
| 2009/0300560 | A1 | 12/2009 | Weber et al. | |

OTHER PUBLICATIONS

Booth, "A Signed Binary Multiplication Technique," *Quart. Journ. Mech. And Applied Math.*, vol. IV, Pt. 2, pp. 236-240 (1951).
Brand, "Verification of Large Synthesized Designs," *Int'l Conf. on Computer-Aided Design*, 4 pp. (Nov. 1993).

(Continued)

*Primary Examiner* — Tan V. Mai
(74) *Attorney, Agent, or Firm* — Klarquist Sparkman, LLP (57) ABSTRACT

Disclosed below are representative embodiments of methods, apparatus, and systems for performing formal verification. For example, certain embodiments can be used to formally verify a Booth multiplier. For instance, in one example embodiment, a specification of a Booth multiplier circuit is received; an initial model checking operation is performed for a smaller version of the Booth multiplier circuit; a series of subsequent model checking operations are performed for versions of the Booth multiplier circuit that are incrementally larger than the smaller version of the Booth multiplier circuit, wherein, for each incrementally larger Booth multiplier circuit, two or more model checking operations are performed, the two or more model checking operations representing decomposed proof obligations for showing; and a verification result of the Booth multiplier circuit is output.

19 Claims, 5 Drawing Sheets

(56) References Cited

OTHER PUBLICATIONS

Bryant, "Graph-Based Algorithms for Boolean Function Manipulation," *IEEE Trans. on Computers*, pp. 677-691 (Aug. 1986).

Bryant, "On the Complexity of VLSI Implementations and Graph Representations of Boolean Functions with Application to Integer Multiplication," *IEEE Trans. on Computers*, 21 pp. (Jul. 1998).

Bryant et al., "Verification of Arithmetic Circuits with Binary Moment Diagrams," *Design Automation Conf.*, 7 pp. (Jun. 1995).

Burch, "Using BDDs to Verify Multipliers," *Design Automation Conf.*, pp. 408-412 (Jun. 1991).

Chang et al., "Induction-Based Gate-Level Verification of Multipliers," *Int'l Conf. On Computer-Aided Design*, pp. 190-193 (Nov. 2001).

Chang et al., "Self-Referential Verification of Gate-Level Implementations of Arithmetic Circuits," *Design Automation Conf.*, pp. 311-316 (Jun. 2002).

Fujita, "Verification of Arithmetic Circuits by Comparing Two Similar Circuits," *Proc. of the 8th Int'l Conf. on Computer-Aided Verification*, pp. 159-168 (Jul. 1996).

Hamaguchi et al., "Efficient Construction of Binary Moment Diagrams for Verifying Arithmetic Circuits," *IEEE Int'l Conf. on Computer-Aided Design*, pp. 7882 (Nov. 1995).

Jacobi et al., "Automatic Formal Verification on Fused-Multiply-Add FPUs," Design, *Automation and Test in Europe Conf.*, 6 pp. (Mar. 2005).

Jha et al., "Beaver: Engineering an Efficient SMT Solver for Bit-Vector Arithmetic," *Computer Aided Verification*, 6 pp. (Jun. 2009).

Kaivola et al., "Formal Verification of the Pentium 4 Floating-Point Multiplier," *Design, Automation and Test in Europe Conf.*, 8 pp. (Mar. 2002).

Keim et al., "Polynomial Formal Verification of Multipliers," *IEEE VLSI Test Symp.*, pp. 150-155 (May 1997).

Krautz et al., "Verifying Full-Custom Multipliers by Boolean Equivalence Checking and an Arithmetic Bit Level Proof," *Design Automation Conf.*, pp. 398-403 (Mar. 2008).

Mishchenko et al., "FRAIGs: A Unifying Representation for Logic Synthesis and Verification," ERL Technical Report, EECS Dept., UC Berkeley, 7 pp. (Mar. 2005).

Mishchenko et al., "Improvements to Combinational Equivalence Checking," *Int'l Conf. on Computer-Aided Design*, 8 pp. (Nov. 2006).

Reeber, "Combining ACL2 and an Automated Verification Tool to Verify a Multiplier," *Proc. of the 6th Int'l Workshop on the ACL2 Theorem Prover and its Applications*, pp. 63-70 (Aug. 2006).

Stoffel et al., "Equivalence Checking of Arithmetic Circuits on the Arithmetic Bit Level," *IEEE Trans on CAD of Integrated Circuits and Systems*, vol. 23, No. 5, pp. 586-597 (May 2004).

Wallace, "A Suggestion for a Fast Multiplier," *IEEE Trans. on Electronic Computers*, pp. 14-17 (Feb. 1964).

\* cited by examiner

FORMAL VERIFICATION OF BOOTH MULTIPLIERS

CROSS REFERENCE TO RELATED APPLICATION

This application claims the benefit of U.S. Provisional Application No. 61/696,928, filed on Sep. 5, 2012, and entitled "FORMAL VERIFICATION OF BOOTH MULTIPLIERS", which is hereby incorporated herein by reference.

FIELD

This application relates to the formal verification of circuit components (such as multipliers) as may be performed during the design of an integrated circuit or other circuit.

SUMMARY

Disclosed below are representative embodiments of methods, apparatus, and systems for performing formal verification. For example, certain embodiments can be used to formally verify a Booth multiplier. The disclosed methods, apparatus, and systems should not be construed as limiting in any way. Instead, the present disclosure is directed toward all novel and/or nonobvious features and aspects of the various disclosed embodiments, alone or in various combinations and subcombinations with one another.

For instance, in one example disclosed herein, a specification of an n×n-bit multiplier circuit is received; a direct model checking operation is performed for an M×n-bit multiplier circuit, where M<n; a series of model checking operations is performed for multiplier circuits that are incrementally larger than the M×n-bit multiplier circuit; and a verification result of the n×n-bit multiplier circuit specification is output based on the direct modeling checking operation and the series of model checking operations. In some implementations, the performing a series of model checking operations comprises, for each incrementally larger M×n-bit multiplier circuit, performing two or more separate model checking operations. The two or more separate model checking operations can comprise using a satisfiability-modulo-theory ("SMT") solver and a bit-level solver. In certain implementations, the performing a direct model checking operation comprises performing a bit-level model checking operation. In some implementations, the multiplier circuit is a Booth multiplier circuit. In certain implementations, the specification is a parameterized specification written in a hardware description language.

In another example disclosed herein a specification of a Booth multiplier circuit is received; an initial model checking operation is performed for a smaller version of the Booth multiplier circuit; a series of subsequent model checking operations are performed for versions of the Booth multiplier circuit that are incrementally larger than the smaller version of the Booth multiplier circuit, wherein, for each incrementally larger Booth multiplier circuit, two or more model checking operations are performed, the two or more model checking operations representing decomposed proof obligations for showing; and a verification result of the Booth multiplier circuit is output. In certain implementations, the initial model checking operation is performed by a bit-level solver. In some implementations, the initial model checking operation comprises performing model checking for an M×n-bit Booth multiplier circuit, where M is less than 5. In further implementations, for each incrementally larger Booth multiplier circuit, M is incremented by 1. In certain implementations, a first of the two or more model checking operations comprises model checking between two behavioral multipliers and a second of the two or more model checking operations comprises model checking between two Booth multipliers. Further, the first of the two or more model checking operations can be performed by a SMT solver and the second of the two or more model checking operations can be performed by a bit-level solver. In some implementations, the specification is a parameterized specification written in a hardware description language.

The foregoing and other objects, features, and advantages of the disclosed technology will become more apparent from the following detailed description, which proceeds with reference to the accompanying figures.

DETAILED DESCRIPTION

I. General Considerations

Disclosed below are representative embodiments of methods, apparatus, and systems for performing formal verification of circuit components (such as Booth multipliers). The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "decompose" to describe the disclosed methods. These terms are high-level abstractions of the actual operations that are performed. The actual operations that correspond to these terms may vary depending on the particular implementation and are readily discernible by one of ordinary skill in the art. Additionally, as used herein, the term "and/or" means any one item or combination of any items in the phrase.

II. Exemplary Computing Environments for
Implementing Embodiments of the Disclosed
Technology Any of the disclosed methods can be implemented as computer-executable instructions stored on one or more computer-readable media (e.g., one or more optical media discs, volatile memory components (such as DRAM or SRAM), or nonvolatile memory components (such as hard drives)) and executed on a computer (e.g., any suitable computer, including desktop computers, servers, smart phones, tablet computers, netbooks, or other devices that include computing hardware). Any of the computer-executable instructions for implementing the disclosed techniques as well as any data created and used during implementation of the disclosed embodiments can be stored on one or more computer-readable media (e.g., non-transitory computer-readable media). The computer-executable instructions can be part of, for example, a dedicated software application or a software application that is accessed or downloaded via a web browser or other software application (such as a remote computing application). Such software can be executed, for example, on a single local computer or in a network environment (e.g., via the Internet, a wide-area network, a local-area network, a client-server network (such as a cloud computing network), a distributed computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Python, C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods can also be implemented by specialized computing hardware that is configured to perform any of the disclosed methods. For example, the disclosed methods can be implemented (entirely or at least in part) by an integrated circuit (e.g., an application specific integrated circuit ("ASIC") or programmable logic device ("PLD"), such as a field programmable gate array ("FPGA")).

Figure 1:
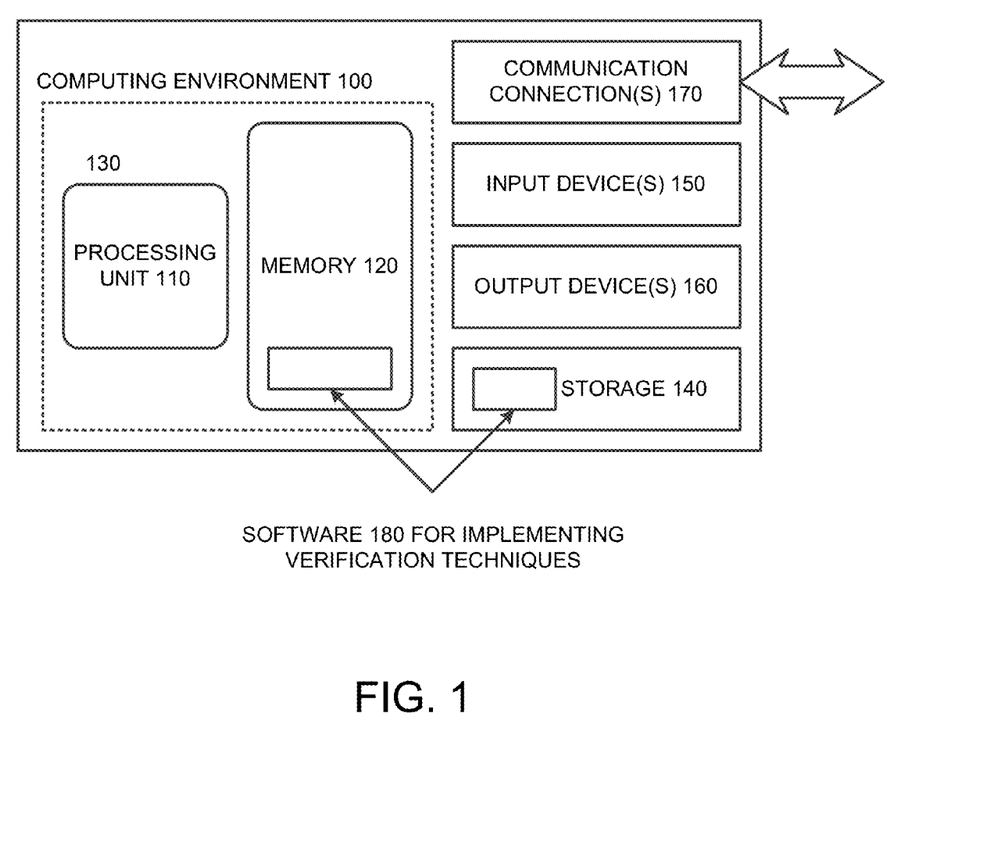
FIG. 1 is a block diagram illustrating a computing environment in which aspects of the disclosed technology can be performed.

FIG. 1 illustrates a generalized example of a suitable computing environment 100 in which several of the described embodiments can be implemented. The computing environment 100 is not intended to suggest any limitation as to the scope of use or functionality of the disclosed technology, as the techniques and tools described herein can be implemented in diverse general-purpose or special-purpose environments that have computing hardware.

With reference to FIG. 1, the computing environment 100 includes at least one processing unit 110 and memory 120. In FIG. 1, this most basic configuration 130 is included within a dashed line. The processing unit 110 executes computer-executable instructions. In a multi-processing system, multiple processing units execute computer-executable instructions to increase processing power. The memory 120 may be volatile memory (e.g., registers, cache, RAM), non-volatile memory (e.g., ROM, EEPROM, flash memory), or some combination of the two. The memory 120 stores software 180 implementing one or more of the described verification tools or techniques described herein. For example, the memory 120 can store software 180 for implementing any of the disclosed techniques described herein and their accompanying user interfaces.

The computing environment can have additional features. For example, the computing environment 100 includes storage 140, one or more input devices 150, one or more output devices 160, and one or more communication connections 170. An interconnection mechanism (not shown), such as a bus, controller, or network, interconnects the components of the computing environment 100. Typically, operating system software (not shown) provides an operating environment for other software executing in the computing environment 100, and coordinates activities of the components of the computing environment 100.

The storage 140 can be removable or non-removable, and includes magnetic disks, magnetic tapes or cassettes, CD-ROMs, DVDs, or any other tangible non-transitory non-volatile storage medium which can be used to store information and which can be accessed within the computing environment 100. The storage 140 can also store instructions for the software 180 implementing any of the described techniques, systems, or environments.

The input device(s) 150 can be a touch input device such as a keyboard, touchscreen, mouse, pen, trackball, a voice input device, a scanning device, or another device that provides input to the computing environment 100. The output device(s) 160 can be a display device (e.g., a computer monitor, smartphone display, tablet display, netbook display, or touchscreen), printer, speaker, or another device that provides output from the computing environment 100.

The communication connection(s) 170 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods can be described in the general context of computer-readable instructions stored on one or more computer-readable media. Computer-readable media are any available media that can be accessed within or by a computing environment. By way of example, and not limitation, with the computing environment 100, computer-readable media include tangible non-transitory computer-readable media, such as memory 120 and/or storage 140, and do not include propagating carrier waves.

The various methods disclosed herein can also be described in the general context of computer-executable instructions (such as those included in program modules) being executed in a computing environment by a processor.

Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 2:
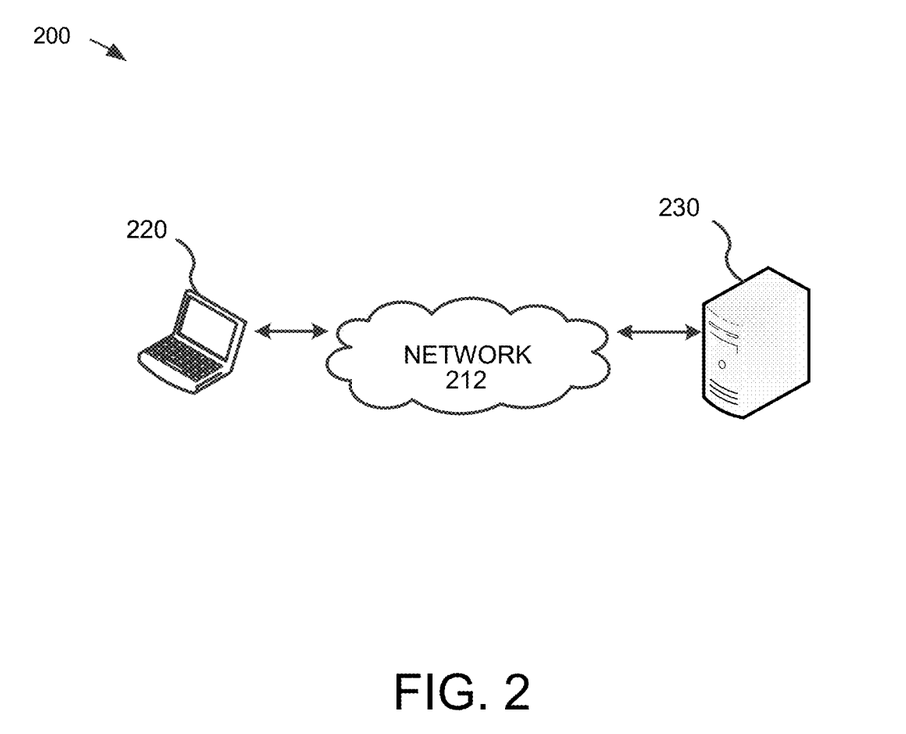
FIG. 2 is a block diagram showing an exemplary network environment in which aspects of the disclosed technology can be performed.

An example of a possible network topology 200 (e.g., a client-server network) for implementing a system according to the disclosed technology is depicted in FIG. 2. Networked computing device 220 can be, for example, a computer running a browser or other software connected to a network 212. The computing device 220 can have a computer architecture as shown in FIG. 1 and discussed above. The computing device 220 is not limited to a traditional personal computer but can comprise other computing hardware configured to connect to and communicate with a network 212 (e.g., smart phones or other mobile computing devices, servers, network devices, dedicated devices, and the like). In the illustrated embodiment, the computing device 220 is configured to communicate with a server 230 (e.g., a remote server) via a network 212. In the illustrated embodiment, the computing device 220 is configured to transmit input data to the server 230 and the server 230 is configured to implement any of the disclosed methods and provide results to the computing device 220. Any of the data received from the computing device 230 can be stored or displayed on the computing device 220 (e.g., displayed as data on a graphical user interface or web page at the computing devices 220). In the illustrated embodiment, the illustrated network 212 can be implemented as a Local Area Network ("LAN") using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 212 can be the Internet or a similar public network and operate using an appropriate protocol (e.g., the HTTP protocol).

Figure 3:
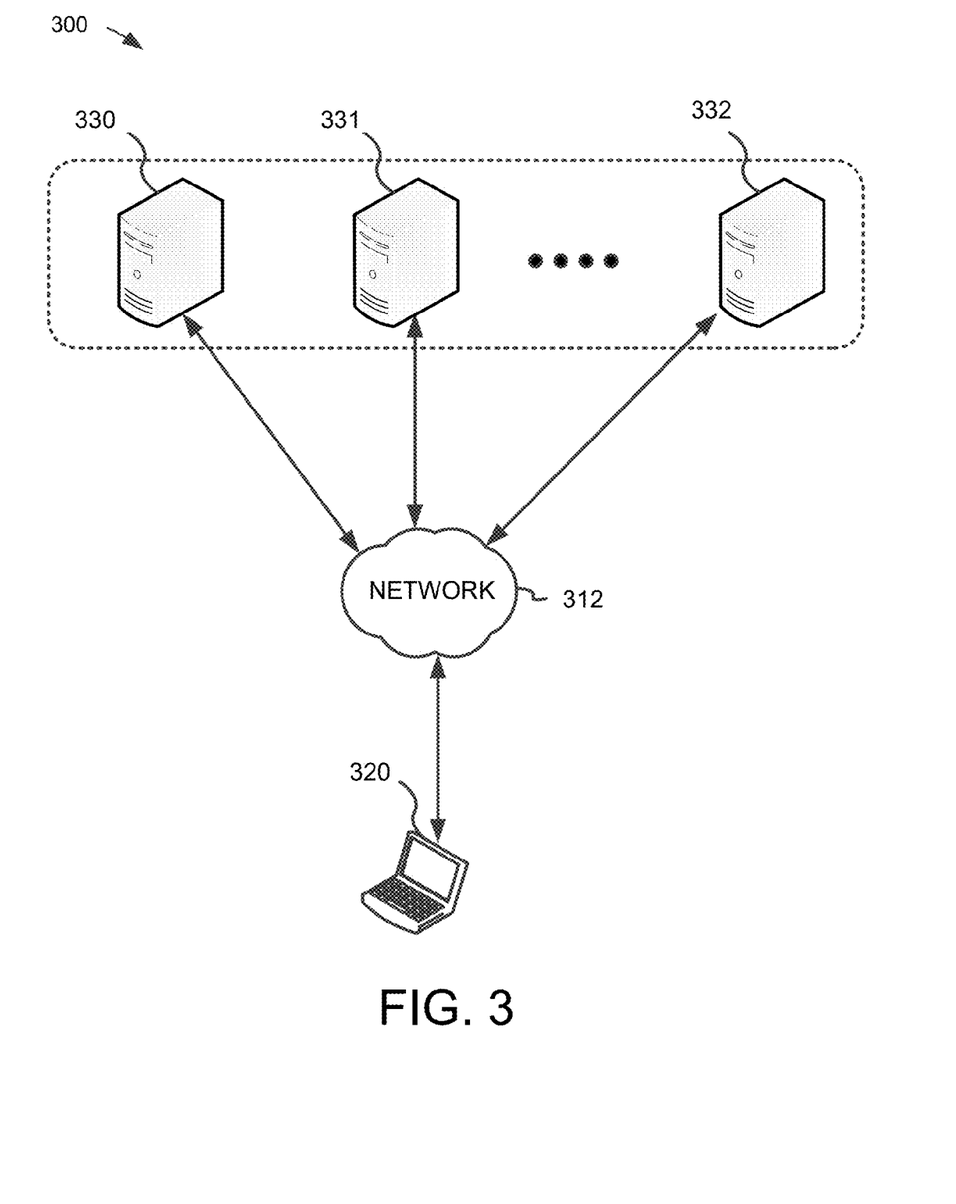
FIG. 3 is a schematic block diagram of another exemplary network environment in which aspects of the disclosed technology can be performed.

Another example of a possible network topology 300 (e.g., a distributed computing environment) for implementing a system according to the disclosed technology is depicted in FIG. 3. Networked computing device 320 can be, for example, a computer running a browser or other software connected to a network 312. The computing device 320 can have a computer architecture as shown in FIG. 1 and discussed above. In the illustrated embodiment, the computing device 320 is configured to communicate with multiple computing devices 330, 331, 332 (e.g., remote servers or other distributed computing devices) via the network 312. In the illustrated embodiment, each of the computing devices 330, 331, 332 in the computing environment 300 is used to perform at least a portion of the verification process. In other words, the computing devices 330, 331, 332 form a distributed computing environment in which the verification process is shared across multiple computing devices. The computing device 320 is configured to transmit input data to the computing devices 330, 331, 332, which are configured to distributively implement a verification process, including performance of any of the disclosed methods, and to provide results to the computing device 320. Any of the data received from the computing devices 330, 331, 332 can be stored or displayed on the computing device 320 (e.g., displayed as data on a graphical user interface or web page at the comput-ing devices 320). The illustrated network 312 can be any of the networks discussed above with respect to FIG. 2.

III. Embodiments of the Disclosed Formal Verification Method

A. Introduction

Described herein are methods, systems, and apparatus that can be used to perform formal verification. Embodiments of the disclosed technology can be used in a variety of applications in which formal verification is desired. For instance, the methods can be implemented as part of an electronic design automation ("EDA") software tool (e.g., an RTL or other HDL verification tool) that performs functional verification of a circuit design.

In general, embodiments of the disclosed technology can be used to perform formal verification of Booth Multipliers. Traditional approaches fail for industrial designs, which are typically hand-optimized and specified at the bit-level. In certain embodiments of the disclosed technology, the end-to-end proof is decomposed into a series of lemmas. In particular implementations, the decomposition does not use any manual modeling and also does not use lemmas or other verification hints specified for sub-circuits. A wide variety of verification tools can be used to at least partially implement embodiments of the disclosed technology, including commercially available verification tools (such as the SLEC tool from Calypto Design Systems). For instance, the SLEC tool can be used to provide formal end-to-end proofs of correctness for multipliers (e.g., multipliers of up to 64) within hours or, in some cases, minutes or seconds.

B. Background

Many interesting digital designs include datapaths that have nontrivial arithmetic. For example, within a microprocessor, the floating point unit ("FPU") includes complicated arithmetic, and the arithmetic logic unit ("ALU") can include complicated arithmetic circuits to handle large integers. Other chips such as digital signal processors ("DSPs") can additionally include a variety of complex arithmetic subcircuits.

As noted, embodiments of the disclosed technology can be used to perform formal verification of multipliers. Multiplier circuits typically input two numbers a and b and compute the product a·b. Multipliers typically have large area and power requirements, and therefore are the focus of many hand optimizations. This makes their implementations non-trivial and bug prone.

Verification of multipliers is difficult because of the large input space. Formal verification is used to treat the inputs symbolically and verify the correctness of the implementation for all possible input values. Unfortunately, multipliers are known-challenging circuits, and the formal verification of hand-optimized multipliers remains an open problem. Within industrial settings, multipliers are typically handled separately from the other arithmetic logic and verified using simulation or formally with a theorem prover.

In particular implementations of the disclosed technology discussed in more detail below, the formal verification of a hand-optimized radix-4 Booth Multiplier is considered. In particular, the equivalence a·b=booth(a, b) is proven, where a·b is a generic product and where booth(a, b) is specified at the behavioral level in a hardware description language ("HDL"). In this way, an end-to-end proof that the multiplier is implemented correctly is provided. Unlike other approaches, embodiments of the disclosed technology do not require deep inspection or understanding of a complex implementation. Further, in certain embodiments, no theorems or other knowledge about subcircuitry is required.

Monolithic verification of a·b=booth(a, b) is challenging, and in embodiments of the disclosed technology, the verification is decomposed into a series of proof obligations. In particular implementations, the correctness of an m×n-bit multiplier for m<n is considered. To start, it can be proven that $a_{m-1} \cdot b_n = \text{booth}(a_{m-1}, b_n)$, where the subscripts denote bit-widths. This lemma can be leveraged to show that $a_m \cdot b_n = \text{booth}(a_m, b_n)$. This strategy can be exploited to build up to the verification of the n×n-bit multiplier.

The decomposition performed by embodiments of the disclosed technology is designed to make each proof obligation tractable, and the composition of the lemmas proves that an n-bit multiplier is correct. The decomposition approach described herein can be applied to a variety of multiplier widths (e.g., up to 64-bits), allowing a complete end-to-end formal proof can be obtained in hours or, in some cases, minutes or seconds.

Among the various features and advantages that can be realized using embodiments of the disclosed technology are any one or more of the following: (1) an end-to-end formal verification of a hand-optimized multiplier against a generic a·b specification that can be obtained without any manual modeling; (2) a formal verification methodology where lemmas that capture the behavior of subcircuits can be avoided (consequently, deep design inspection is not required); (3) a formal verification methodology where specific bit-blasting of the behavioral specification can be avoided (e.g., no effort to make the bit-blasting as close as possible to the implementation is required); and/or (4) a formal verification methodology that can use commercially available EDA tools.

C. Multipliers

Multiplication is comprised of two basic operations: the generation of partial products and accumulation of these partial products. A high speed multiplier implementation may try to reduce the number of partial products, reducing the complexity as well as the time needed to accumulate the partial products. A multiplier implementation has two inputs, multiplier and multiplicand, and the partial products are multiples of the multiplicand. Booth's Algorithm reduces the number of partial products by leveraging groups of consecutive zeros and ones in the multiplier. For a group of consecutive zeros in the multiplier, it is possible to avoid generating additional partial products and only shift the previously accumulated partial products. Similarly, for a group of n consecutive 1's in a multiplier, it is possible to generate fewer than n new partial products. For example, the sequence 1111 equals 10000−1, and while other multiplication algorithms would generate n=4 partial products for this multiplier sequence, Booth's Algorithm generates just two.

In experiments performed using embodiments of the disclosed verification technology and discussed below, a two-input and a single-output multiplication design using a radix-4 Booth's algorithm was verified. The radix-4 Booth's encoding requires looking at three bits of the multiplier at a time rather than two as described in Booth's original algorithm, further reducing the number of partial products. The partial products are constant multiples of the multiplicand a, with the appropriate constant selected based on three consecutive bits b[i], b[i−1], and b[i−2] of multiplier b. Table 1 summarizes the partial products that are generated.

TABLE 1

Partial products in a Radix-4 Booth's Encoding for a multiplicand a and multiplier b.

| b[i] | b[i − 1] | b[i − 2] | Partial Prod. | Comment |
|---|---|---|---|---|
| 0 | 0 | 0 | +0 | String of zeros |
| 0 | 1 | 0 | +a | Single one |
| 1 | 0 | 0 | −2a | Beginning of 1's |
| 1 | 1 | 0 | −a | Beginning of 1's |
| 0 | 0 | 1 | +a | End of 1's |
| 0 | 1 | 1 | +2a | End of 1's |
| 1 | 0 | 1 | −a | Single 0 |
| 1 | 1 | 1 | +0 | String of 1's |

The Booth Multiplier that was verified uses a radix-4 encoding scheme to reduce the number of partial products. To further optimize hardware, various bit level techniques were used to represent the partial products in the multiplier. One technique used was to minimize the required width of negative partial products and use one's complement representation, leading to fewer number of required addition operations. Also, these partial products were accumulated using a Wallace tree to compute the final multiplication result, reducing the number of full adders in the design. This example multiplier implementation was highly optimized, leading to a complex bit-level representation. The model was dissimilar from any known reference implementation, and it would be impractical to develop a manual abstraction of the multiplier for verification purposes. To perform verification of the multiplier, an approach was needed that treated the implementation as a black box without requiring design specific details and modeling.

D. Equivalence Checking

In embodiments discussed herein, equivalence checking of multipliers that do not include pipeline stages is performed. For this reason, combinational equivalence checking ("CEC") is used. Designs specified at the word-level can be equated using Satisfiability Modulo Theories ("SMT"). SMT solvers typically incorporate many solver engines, or theories, within a unified framework. For verification of logic designs, the theory of bit vectors is the most utilized. SMT solvers work well for designs that are specified at a high level, but the algorithms break down when gate level information is introduced into the model.

Designs specified at the bit-level can be equated using model checking techniques. For example, one of the best practices in CEC is to equate two circuits with a high degree of structural similarity. This enables the model checker to identify pairs of signals (spec, impl) that are equivalent in the specification and implementation. Redundancy removal simplifies the product machine and greatly aids the overall verification process. A particularly efficient implementation of redundancy removal that utilizes a Satisfiability ("SAT") solver and that is used in embodiments of the disclosed technology is described by A. Mishchenko et al., "FRAIGS: A unifying representation for logic synthesis and verification," ERL Technical Report, EECS Dept., UC Berkeley (March 2005) and A. Mishchenko et al., "Improvements to combinational equivalence checking," *IEEE ICCAD*, pp. 836-843 (2006).

In embodiments of the disclosed verification approach, the verification of a multiplier is decomposed into several sub-problems. In particular implementations, half of these sub-problems are specified at the word-level and are well suited for SMT techniques. The remaining problems involve hand-optimized bit-level logic. The decomposition can be done in such a way that the structural similarity is maximized, aiding the SAT-based redundancy removal framework. In a particular implementation, the SLEC verification tool from Calypto Design Systems is used. SLEC incorporates an SMT solver that has been optimized for the theory of bit vectors, and it also includes a suite of bit-level model checking algorithms. SLEC has diverse capabilities that enable it to handle the two extremes of the described subproblems: word-level and bit-level. Furthermore, SLEC is a sequential equivalence checking tool that allows for the possibility of verifying pipelined multipliers without changing the toolchain.

E. Decomposed Verification

In the example below, the correctness of an n-bit radix-4 Booth Multiplier is verified, though the disclosed approach can be adapted to verify other multipliers or circuits. To perform the verification of the Booth Multiplier, the combinational equivalence $a_n \cdot b_n = \text{booth}(a_n, b_n)$, where the subscripts denote bit-widths, can be proven. Here the left hand side is a behavioral description of a multiplier (a * operator in an HDL), and the right hand side is a hand-optimized radix-4 Booth Multiplier.

This verification becomes challenging as n increases. The presence of optimized logic necessitates the use of bit-level equivalence checking, but unfortunately there is no structural similarity between the specification $a_n \cdot b_n$ and the implementation $\text{booth}(a_n, b_n)$. It has been observed that n=12 can be proven in seconds while n=20 can be proven in hours. Beyond this, and without using embodiments of the disclosed verification techniques, the verification is intractable.

Embodiments of the disclosed techniques are based on the following principles. First, any n-bit number $a_n$ can be decomposed into its most significant bit $ah_1$ and the lower n−1 bits $al_{n-1}$. Using this decomposition, the multiplication with any number C can be rewritten as:

$$a_n \cdot C = (ah_1 \cdot 2^{n-1} + al_{n-1}) \cdot C$$
$$= (ah_1 \cdot C) \cdot 2^{n-1} + al_{n-1} \cdot C.$$

Second, consider the multiplication of two numbers of possibly different bit widths: $a_m \cdot b_n$. The equivalence $a_m \cdot b_n = \text{booth}(a_m, b_n)$ can be decomposed into a series of 3 proof obligations:

$$a_m \cdot b_n = (ah_1 \cdot b_n) \cdot 2^{n-1} + al_{m-1} \cdot b_n \tag{1}$$

$$(ah_1 \cdot b_n) \cdot 2^{n-1} + al_{m-1} \cdot b_n = (ah_1 \cdot b_n) \cdot 2^{n-1} + \text{booth}(al_{m-1}, b_n) \tag{2}$$

$$(ah_1 \cdot b_n) \cdot 2^{n-1} + \text{booth}(al_{m-1}, b_n) = \text{booth}(a_m, b_n) \tag{3}$$

Equation 1 describes the decomposition of a multiplication with a into a multiplication with ah and al. The left and right hand sides of this equation are written in terms of behavioral multipliers, and this can be reasoned about at the word level with an SMT solver.

Equation 2 describes the substitution of a behavioral multiplier $al_{m-1} \cdot b_n$ for a Booth Multiplier. Suppose the lemma $al_{m-1} \cdot b_n = \text{booth}(al_{m-1}, b_n)$ has already been proven. With this lemma, Equation 2 becomes trivial.

Figure 4:
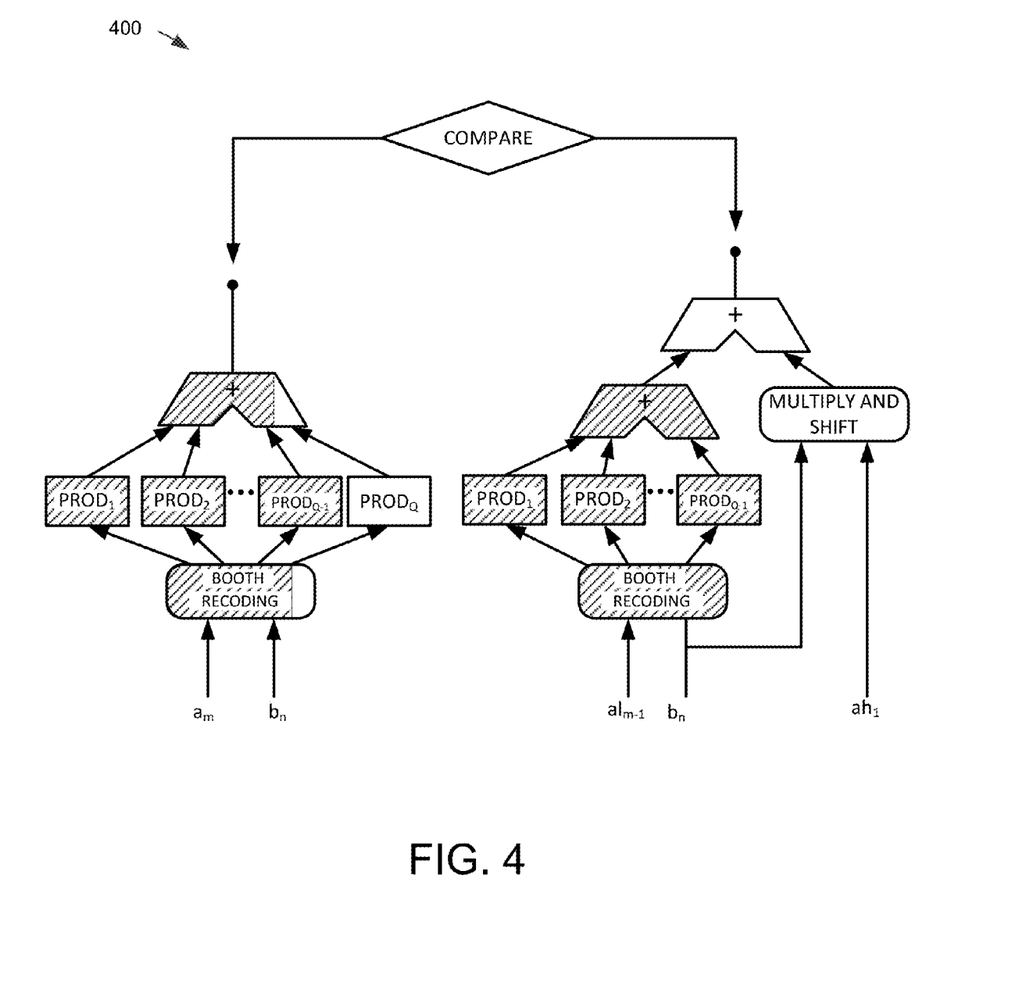
FIG. 4 is a schematic block diagram depicting how the proof of Equation 3 can be performed, where shaded logic is logic that is common between the two designs.

Equation 3 is similar to the decomposition of Equation 1 but over Booth Multipliers. Here the left and right hand sides include hand-optimized code which should be verified with a bit-level solver. FIG. 4 is a schematic block diagram that depicts this verification problem. The Booth Multiplier generates $$Q = \left\lceil \frac{n-1}{2} \right\rceil$$

partial products and sums the partial products to form the final result. Here the left and right hand sides differ in the widths of their Booth Multipliers, but they retain much structural similarity. Much of the recoder logic is identical, the first Q−1 partial products are identical, and much of the summation of the partial products is identical. Indeed, most of the logic depicted in FIG. 4 is common to both the left and right hand sides. By maximizing the structural similarity, the bit-level solver can be given the greatest chances of success in verifying this equivalence.

By decomposing $a_m \cdot b_n = \text{booth}(a_m, b_n)$ into three separate proof obligations, the verification process is made tractable. However, the verification of Equation 2 assumed that $a_{m-1} \cdot b_n = \text{booth}(a_{m-1}, b_n)$. Indeed, a series of runs can be performed to verify different bit widths and build up to the desired $a_n \cdot b_n = \text{booth}(a_n, b_n)$:

Base Case: For some small value M, prove $$a_M \cdot b_n = \text{booth}(a_M, b_n)$$

Inductive Step: For j in M+1 to n, prove $$a_j \cdot b_n = \text{booth}(a_j, b_n)$$

The composition of the base case and inductive step yields a sound proof for $a_n \cdot b_n = \text{booth}(a_n, b_n)$. In certain embodiments, the base case is verified directly. For a sufficiently small M (e.g., M is less than or equal 20, 10, 5, 4, 3, or 2), the equivalency can be verified directly with a bit-level solver despite the lack of structural similarity.

For each proof obligation in the inductive step, the decompositions shown in Equations 1-3 can be utilized. This means that the verification of an n bit multiplier will be decomposed into 1+3·(n−M) proof obligations where each proof obligation is a tractable problem for the formal verification tool.

Figure 5:
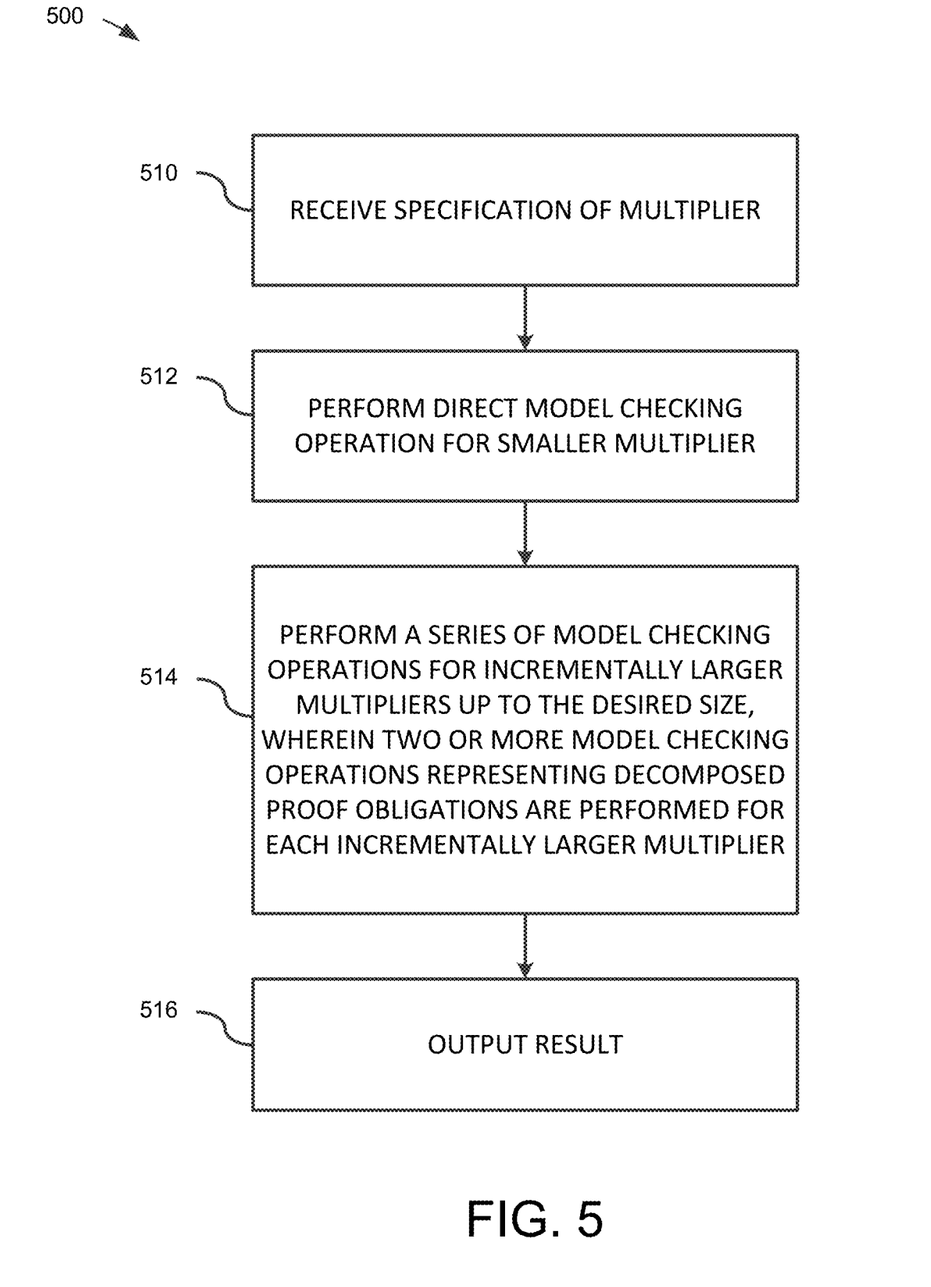
FIG. 5 is a flow chart illustrating an exemplary method for performing formal verification of multipliers.

FIG. 5 is a flow chart 500 illustrating a general exemplary method for performing formal verification using an embodiment of the disclosed technology. The method acts shown in FIG. 5 should not be construed as limiting, as any one or more of the method acts may be omitted, performed in a different order, or supplemented with one or more additional method acts.

At 510, a specification of an m×n-bit multiplier circuit is received (e.g., input, buffered into memory, or otherwise prepared for further processing). The specification of the multiplier can be input by a user or loaded from a stored file or database. The specification of the multiplier circuit can be written in a suitable hardware description language ("HDL"), such as Verilog, VHDL, SystemVerilog, or the like, and can be parameterized. Further, in certain embodiments, the specification is provided in an even higher-level language, such as C, C++, SystemC, or other such languages. Additionally, for example purposes, the multiplier will be assumed to be a Booth Multiplier, though it is possible to apply the principles of the disclosed technology to other multipliers or other circuits.

At 512, a direct model checking operation for a smaller base case is performed, the base case being for a multiplier circuit having a bit width less than the m×n-bit multiplier circuit. For example, the base case $a_M \cdot b_n = \text{booth}(a_M, b_n)$ can be proven directly for some small M (e.g., M less than or equal to 20, 10, 5, 4, 3, or 2). In certain implementations, the smaller model can be derived automatically from the parameterized HDL. In particular implementations, a bit-level solver can be used to perform the model checking despite the lack of structural similarity. For instance, a bit-level model checking algorithm (such as those used in Calypto's SLEC and/or based on the techniques described by Mishchenko).

At 514, a series of model checking operations for gradually larger multipliers up to the m×n-bit multiplier circuit are performed. For example, and in correspondence with the inductive step described above, for j in M+1 to n, the equivalence $a_j \cdot b_n = \text{booth}(a_j, b_n)$ can be determined. The incremental change for each larger multiplier may can be an incremental change to just m, just n, or both m and n, and can be performed in increments of 1 or (in some cases) larger integer increments (such as 2, 3, 4, or 5). In certain implementations, the incrementally larger models are derived automatically. Additionally, in particular implementations, for each incrementally larger multiplier under consideration, the equivalence checking can be performed by two or more model checking operations (representing a decomposition of the equivalence problem into two or more smaller, discrete sub-problems). For instance, the model checking operations performed for each intermediate multiplier can correspond to decomposed proof obligations that are discrete and separate from one another but that collectively show the equivalence of the behavioral specification of the multiplier to the desired multiplication operation. In certain implementations, the two or more model checking operations for a gradually larger multiplier corresponding to the proof obligations of Equations 1 and 3. Furthermore, the decomposed proof obligations can be checked using separate model checking techniques. For instance, Equations 1 and 3 can be checked for a multiplier specification using an SMT solver for Equation 1 and a bit-level solver for the Equation 3. Model checking of Equation 2 can be omitted or included, if desired.

At 516, a result of the verification of the specification of the m×n-bit multiplier is output. For example, an indication can be generated (e.g., for display to the user or for saving as part of a file or database) that indicates whether the specification of the m×n-bit multiplier passed or failed the formal verification. Furthermore, if the specification does not pass the verification, information about why the verification failed can be generated (e.g., for display to the user or for saving as part of a file or database).

G. Experimental Results

Experiments were performed in which a radix-4 Booth Multiplier as described above was verified. The described verification methodology was applied to the multiplier using the Calypto SLEC tool. In particular, the multiplier that was verified utilized radix-4 Booth Encoding, and the partial products were summed using a Wallace tree. The disclosed methodology was applied to a variety of m×n Booth Multipliers for several different input bit-widths m and n. This was accomplished by parameterizing the design, allowing selection of the desired bit width.

In particular experiments, the decomposition method described in the previous section was applied to an n×n multiplier for a given width n. In the base case, $a_M \cdot b_n = \text{booth}(a_M, b_n)$ using M=3 was verified. Using this value, the models were sufficiently small to enable brute-force techniques, such as BDDs, to succeed. Note that to verify the base case, the specification $a_M \cdot b_n$ was bit blasted. In this particular experiment, this was the only time bit blasting was utilized, and for small values of M, the method of bit blasting is simple.

The inductive step was implemented by checking Equations 1 and 3. Note that, in certain implementations, Equation 2 can be skipped because, after black-boxing, this proof is trivial.

Table 2 lists results for a variety of multiplier widths. For each width n, the base case at M=3 was checked and then Equations 1 and 3 were checked for widths M+1 to n, yielding a proof that $a_n \cdot b_n = \text{booth}(a_n, b_n)$.

TABLE 2

| | | | | | | |
|---|---|---|---|---|---|---|
| Verification of various Booth Multipliers. All times are listed in seconds unless otherwise noted | | | | | | |
| Multiplier Size | Base Case Time | Eqn. 1 Proofs | Eqn. 1 Time | Eqn. 3 Proofs | Eqn. 3 Time | Total Runtime |
| 8 × 8 | 0.2 | 5 | 0.2 | 5 | 1.8 | 2.2 (2.2 sec) |
| 16 × 16 | 0.3 | 13 | 0.6 | 13 | 16.0 | 16.9 (16.9 sec) |
| 23 × 23 | 0.3 | 20 | 1.1 | 20 | 91.4 | 92.8 (1.5 min) |
| 32 × 32 | 0.2 | 29 | 1.3 | 29 | 558.3 | 559.9 (9.3 min) |
| 53 × 53 | 0.3 | 50 | 2.6 | 50 | 19285.0 | 19287.9 (5.4 hours) |
| 64 × 64 | 0.4 | 61 | 3.9 | 61 | 68766.6 | 68770.9 (19.1 hours) |

All experiments were run on a cluster of machines running Linux 2.6 on a 2.4 GHz AMD Opteron processor. Throughout all of the verification runs, the peak memory never exceeded 636 MB. As the multiplier widths increased, the verification runtime increased, and in all cases this was due to the complexity faced by the bit-level solver. The increase in difficulty is gradual, and while multipliers up to width 64 were verified, given more runtime this technique would be able to verify even larger multipliers.

H. Concluding Remarks

The disclosed decomposition techniques can be used to perform formal verification of Booth Multipliers. Embodiments of the disclosed techniques provide a methodology that enables proof that a multiplier is equivalent to an a·b specification. For the described implementation, no manual modelling of the complex bit-level implementation is required, and no intermediate lemmas over sub-circuits need to be specified. Furthermore, no specific bit-blasting support is required to perform verification, allowing the method to verify complex, hand-optimized industrial multipliers using off-the-shelf EDA tools. This disclosure represents a leap forward in the verification of multipliers. Large multipliers can now be formally verified without the need for specialized methods or the manual efforts associated with theorem proving. Although multiplier verification was explored in this disclosure, the principles of the disclosed methodology can be more generalized and applied to other types of arithmetic circuits.

Having illustrated and described the principles of the disclosed technology, it will be apparent to those skilled in the art that the disclosed embodiments can be modified in arrangement and detail without departing from such principles. For example, any one or more aspects of the disclosed technology can be applied in other embodiments. In view of the many possible embodiments to which the principles of the disclosed technologies can be applied, it should be recognized that the illustrated embodiments are only preferred examples of the technology and should not be taken as limiting the scope of the invention.

The invention claimed is:

1. A computer-implemented formal verification method, comprising:

by a computing device,
receiving a specification of an n×n-bit multiplier circuit;
performing a direct model checking operation for a M×n-bit multiplier circuit, where M<n;
performing a series of model checking operations for multiplier circuits that are incrementally larger than the M×n-bit multiplier circuit; and
outputting a verification result of the n×n-bit multiplier circuit specification based on the direct modeling checking operation and the series of model checking operations.

2. The method of claim 1, wherein the performing a series of model checking operations comprises, for each incrementally larger M×n-bit multiplier circuit, performing two or more separate model checking operations.

3. The method of claim 2, wherein the two or more separate model checking operations comprise using a satisfiability-modulo-theory ("SMT") solver and a bit-level solver.

4. The method of claim 1, wherein the performing a direct model checking operation comprises performing a bit-level model checking operation.

5. The method of claim 1, wherein the multiplier circuit is a Booth multiplier circuit.

6. The method of claim 1, wherein the specification is a parameterized specification written in a hardware description language.

7. One or more non-transitory computer-readable media storing computer-executable instructions when executed by a computer cause the computer to perform a method, the method comprising:
receiving a specification of an n×n-bit multiplier circuit;
performing a direct model checking operation for a M×n-bit multiplier circuit, where M<n;
performing a series of model checking operations for multiplier circuits that are incrementally larger than the M×n-bit multiplier circuit; and
outputting a verification result of the n×n-bit multiplier circuit specification based on the direct modeling checking operation and the series of model checking operations.

8. The one or more non-transitory computer-readable media of claim 7, wherein the performing a series of model checking operations comprises, for each incrementally larger M×n-bit multiplier circuit, performing two or more separate model checking operations.

9. The one or more non-transitory computer-readable media of claim 8, wherein the two or more separate model checking operations comprise using a satisfiability-modulo-theory ("SMT") solver and a bit-level solver.

10. The one or more non-transitory computer-readable media of claim 7, wherein the performing a direct model checking operation comprises performing a bit-level model checking operation.

11. The one or more non-transitory computer-readable media of claim 7, wherein the multiplier circuit is a Booth multiplier circuit.

12. The one or more non-transitory computer-readable media of claim 7, wherein the specification is a parameterized specification written in a hardware description language.

13. One or more non-transitory computer-readable media storing computer-executable instructions when executed by a computer cause the computer to perform a method, the method comprising:
receiving a specification of a Booth multiplier circuit;
performing an initial model checking operation for a smaller version of the Booth multiplier circuit;
performing a series of subsequent model checking operations for versions of the Booth multiplier circuit that are incrementally larger than the smaller version of the Booth multiplier circuit, wherein, for each incrementally larger Booth multiplier circuit, two or more model checking operations are performed, the two or more model checking operations representing decomposed proof obligations for showing; and
outputting a verification result of the Booth multiplier circuit.

14. The one or more non-transitory computer-readable media of claim 13, wherein the initial model checking operation is performed by a bit-level solver.

15. The one or more non-transitory computer-readable media of claim 13, wherein the initial model checking operation comprises performing model checking for an M×n-bit Booth multiplier circuit, where M is less than 5.

16. The one or more non-transitory computer-readable media of claim 15, wherein, for each incrementally larger Booth multiplier circuit, M is incremented by 1.

17. The one or more non-transitory computer-readable media of claim 13, wherein a first of the two or more model checking operations comprises model checking between two behavioral multipliers and a second of the two or more model checking operations comprises model checking between two Booth multipliers.

18. The one or more non-transitory computer-readable media of claim 17, wherein the first of the two or more model checking operations is performed by a SMT solver and the second of the two or more model checking operations is performed by a bit-level solver.

19. The one or more non-transitory computer-readable media of claim 13, wherein the specification is a parameterized specification written in a hardware description language.

* * * * *